(12) United States Patent
Asano et al.

(10) Patent No.: US 7,679,176 B2
(45) Date of Patent: Mar. 16, 2010

(54) SEMICONDUCTOR DEVICE AND ELECTRONIC CONTROL UNIT USING THE SAME

(75) Inventors: Masahiko Asano, Mito (JP); Yasuo Akutsu, Mito (JP); Masahide Harada, Yokohama (JP); Kaoru Uchiyama, Hitachiomiya (JP); Shinichi Fujiwara, Kamakura (JP); Isamu Yoshida, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 319 days.

(21) Appl. No.: 11/635,561

(22) Filed: Dec. 8, 2006

(65) Prior Publication Data

US 2007/0145473 A1 Jun. 28, 2007

(30) Foreign Application Priority Data

Dec. 9, 2005 (JP) ............................. 2005-355531

(51) Int. Cl.
*H01L 23/02* (2006.01)

(52) U.S. Cl. .................... 257/686; 257/712; 257/684; 257/E23.085; 257/E25.027; 257/E25.021; 257/E25.018; 257/E25.013; 361/103

(58) Field of Classification Search ........... 257/712, 257/684, 686, E23.085, E25.027, E25.021, 257/E25.018, E25.013; 361/103
See application file for complete search history.

(56) References Cited

U.S. PATENT DOCUMENTS

| 6,097,089 A | 8/2000 | Gaku et al. | |
|---|---|---|---|
| 6,528,882 B2 * | 3/2003 | Ding et al. | 257/738 |
| 6,528,891 B2 * | 3/2003 | Lin | 257/778 |
| 2001/0046725 A1 * | 11/2001 | Ho | 438/121 |
| 2002/0084524 A1 | 7/2002 | Roh et al. | |
| 2003/0002260 A1 * | 1/2003 | Hasebe et al. | 361/720 |
| 2003/0034566 A1 | 2/2003 | Jimarez et al. | |
| 2003/0184969 A1 * | 10/2003 | Itabashi et al. | 361/688 |
| 2004/0021210 A1 * | 2/2004 | Hosomi | 257/686 |
| 2004/0089943 A1 | 5/2004 | Kirigaya et al. | |
| 2004/0125579 A1 * | 7/2004 | Konishi et al. | 361/783 |

FOREIGN PATENT DOCUMENTS

| DE | 101 27 268 A1 | 4/2002 |
|---|---|---|
| EP | 0 981 268 A1 | 2/2000 |
| EP | 1 387 606 A2 | 2/2004 |
| EP | 1 443 561 A2 | 8/2004 |
| EP | 1 571 706 A1 | 9/2005 |
| JP | 2000-315747 | 11/2000 |
| JP | 2003-46022 A | 2/2003 |
| JP | 2004-172425 A | 6/2004 |

OTHER PUBLICATIONS

European Search Report dated Mar. 13, 2007 (Nine (9) Pages).

\* cited by examiner

*Primary Examiner*—Kenneth A Parker
*Assistant Examiner*—David Z Chen
(74) *Attorney, Agent, or Firm*—Crowell & Moring LLP

(57) ABSTRACT

A semiconductor device has a substrate with an electronic circuit, a semiconductor element provided at a first surface of the substrate and electrically connected by wire bonding to the electronic circuit, a metallic core layer electrically connected to the semiconductor element. A plurality of conductive bumps provided opposite the first surface of the substrate. A thermal hardenable resin seals at least the semiconductor element, and a metal plate is electrically connected to the metal core layer.

13 Claims, 4 Drawing Sheets

SEMICONDUCTOR DEVICE AND ELECTRONIC CONTROL UNIT USING THE SAME

BACKGROUND OF THE INVENTION

The present invention relates to semiconductor devices and electronic control unit using the same. More particularly, this invention relates to a semiconductor device having metallic core layers and an electronic control unit using this device.

Prior known semiconductor devices include a device which has a wiring lead frame and a semiconductor circuit element as mounted on a die pad while using wire bonding techniques to connect together electrode portions of the semiconductor element and leads of the lead frame.

However, as semiconductor elements advance in quest for higher integration, semiconductor electrode portions rapidly increase in number, resulting in a semiconductor package increasing in pin number and size thereof. In addition, the advance in integration of circuit elements results in a likewise increase in power consumption per element area. This brings a need for a structure with isotropic heat releasability—namely, isothermal radiator structure—which employs a heat-radiating substrate.

Concerning equipment using semiconductor devices, this is under requirements for further miniaturization and higher packaging density while at the same time offering high performance and high functionality, a small-size semiconductor package with enhanced heat releasability is needed. Accordingly, in recent years, a high-density multiple-pin package having conductive balls, such as a ball grid array (BGA), chip scale package (CSP), flip chip (FC) or the like, has been developed. To improve the heat releasing performance, flip-chip mounting is applied to an interposer substrate with a heat sink being adhered to its upper part for heat radiation.

Additionally, JP-A-2003-46022 discloses therein an electronic device having a metal plate.

However, the above-noted prior art is faced with problems which follow.

In the structure having its lead frame and semiconductor element mounted on the die pad with the semiconductor element's electrode portions and the lead frame's leads being connected together by wire bonding, an attempt to mount a high-function semiconductor device(s) would result in an unwanted increase in size of a sealing resin material, a decrease in reliability after the mounting, and an increase in cost. In addition, a semiconductor device, such as a power supply or a driver or else which constitutes control circuitry, is a component that radiates a large amount of heat. In some cases, a plurality of such high heat-release components are needed. Thus, the application of this type of semiconductor device must have a limit.

On the other hand, in the case of using a high-density package such as BGA or CSP or else, its heating amount increases with an increase in integration and growth in high functionality. This calls for improvements in heat release performance. Additionally, due to the use of a large number of packages, a parts-mount substrate per se is required to decrease or "narrow" the layout pitch in conformity with BGA or CSP. This does not come without accompanying extra cost increase of the mount substrate, so this approach is incapable of offering successful applicability to multi-pin packages.

In case the semiconductor device of this type is employed for electronic control unit that is installed in severe environments, such as in land vehicles, when a narrow-pitch semiconductor package is used, solder bumps become smaller in diameter, resulting in the reliability being lowered at connection portions. Furthermore, in the case of a heat-radiating narrow-pitch semiconductor package being employed, additional design is required such as attachment of a heat sink plate. Some of the components involved fail to obtain the required heat release effect so that these are incapable of being mounted.

Regarding the structure as taught from JP-A-2003-46022, the heat releasability is insufficient. Additionally, its production cost poses problems.

SUMMARY OF THE INVENTION

It is therefore an object of the present invention to provide a semiconductor device with enhanced heat releasability while offering high reliability and productivity at low costs. Another object is to provide an electronic control unit using this device.

To attain the foregoing objects, a semiconductor device in accordance with one aspect of this invention is arranged to include a substrate having a circuit as disposed on a first principal surface (semiconductor element mount face 6a), a semiconductor element which is provided on the first principal surface of the substrate and which is electrically connected by wire bonding to the circuit for interconnection therebetween, a metallic core layer which is provided within the substrate and is electrically connected to the semiconductor element, a plurality of conductive bumps provided on a second principal surface opposite to the first principal surface of the substrate, a thermally hardenable sealing resin with at least the semiconductor element and the first principal surface side of the substrate being sealed therein, and a metal member (metal plate 8) which is provided at the second principal surface and electrically connected to the metallic core layer.

In accordance with another aspect of this invention, a semiconductor device has a multilayer substrate structured by lamination of a plurality of substrate each having a circuit as disposed thereon, a plurality of metallic core layers provided within the plurality of substrates, a semiconductor element which is provided on a first principal surface (semiconductor element mount face 6a) of a substrate residing at a lowermost part of the multilayer substrate and which is electrically connected by wire bonding to the circuit for interconnection therebetween, and a metal member (metal plate 8) which is provided at a second principal surface opposite to the first principal surface of the substrate residing at the lowermost part of the multilayer substrate and which is electrically connected to a metallic core layer residing inside of the substrate residing at the lowermost part.

In accordance with a further aspect of the invention, an electronic control unit includes a metallic casing, a substrate which is disposed in an interior of the metallic casing with a circuit being disposed on the substrate, a semiconductor device disposed on the substrate, and a connector fixed to the metallic casing and having a plurality of pins for connection to the circuit. The semiconductor device has a metallic core layer which is provided therein and which is electrically connected to the semiconductor device, and a metal member which is electrically connected to the metallic core layer and which is exposed to outside of the semiconductor device. The substrate has a thermal via filled with a conductive member. The metal member of the semiconductor device is electrically connected to the conductive member.

According to this invention, it is possible to provide a semiconductor device and electronic control unit or module, which is low in cost and is excellent in heat releasability.

DETAILED DESCRIPTION OF THE INVENTION

Currently preferred embodiments of this invention will be described with reference to the accompanying drawings below.

Embodiment 1

Figure 1:
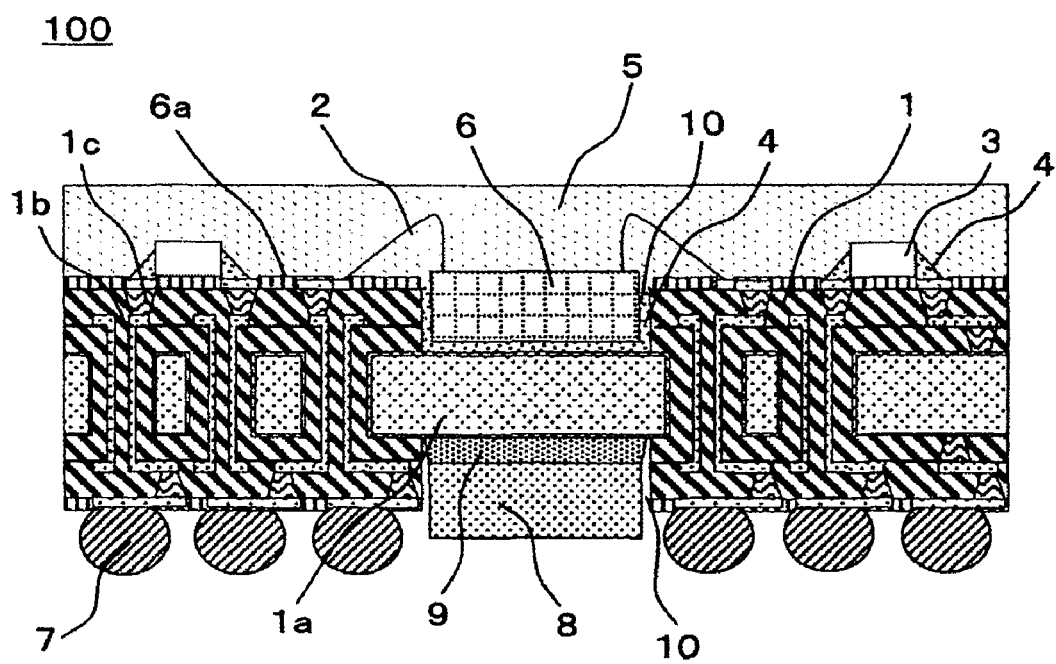
FIG. 1 is a diagram showing a cross-sectional structure of a semiconductor device in accordance with a first embodiment of this invention.
Figure 2:
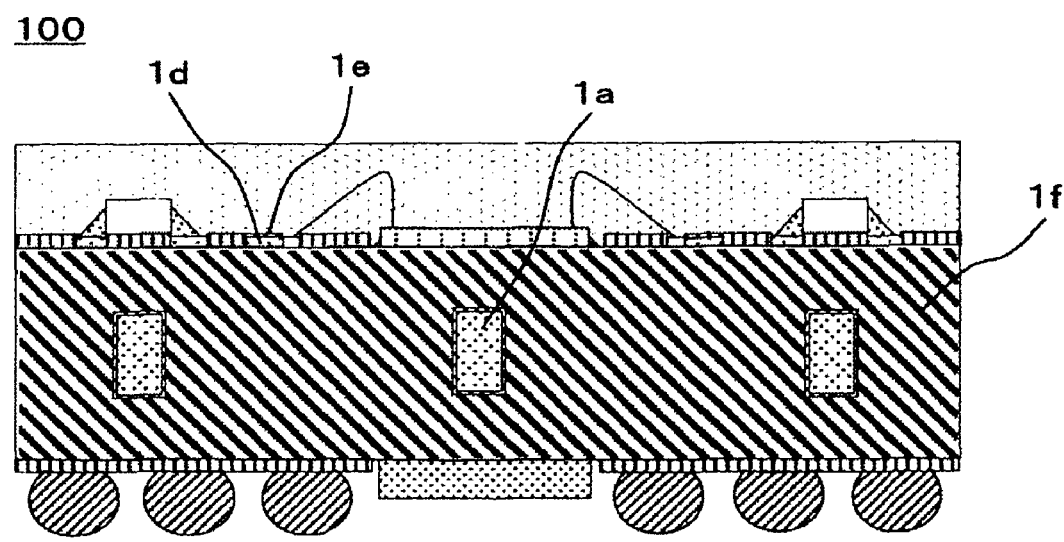
FIG. 2 is a side view of the device shown in FIG. 1.

Referring to FIG. 1, a semiconductor device 100 in accordance with one preferred embodiment of the invention is depicted in cross-section. A side view of this device is shown in FIG. 2.

On a substrate 1 with an electronic circuit arranged thereon, a semiconductor circuit element 6 and an electronic component 3 such as a passive element are disposed. These are fixed to the substrate 1 by use of a conductive adhesive agent 4. The semiconductor element 6 is connected by use of bonding wires 2 to the electronic circuit on the substrate 1. Note here that although in FIGS. 1-2 only one semiconductor element 6 is provided, two or more semiconductor elements 6 may be mounted. Additionally the substrate 1 as used herein is a printed circuit board or a flexible substrate.

The illustrative semiconductor device 100 is resin-sealed by a thermally hardenable sealing resin material 5, such as epoxy resin or equivalents thereof. While the semiconductor element 6 and the electronic component 3 are mounted on the side of a semiconductor element mount face 6a, the thermal hardenable resin 5 is filled on the substrate 1, including the semiconductor element 6 and electronic component 3. It is desirable that the thermal hardenable resin 5 be matched in physical properties with the substrate 1 for reliability improvement purposes. To this end, the physical properties of the thermal hardenable resin 5 after hardening are preferably set so that the linear expansion coefficient falls within a range of from 7 to 25 ppm/° C. and the elasticity ranges from 7 to 30 Gpa with the glass transition temperature ranging from 70 to 200° C.

On a principal surface of the substrate 1 on the opposite side to the semiconductor element mount face 6a, a prespecified number of conductive bumps 7 are provided. These conductive bumps 7 are laid out to enable the semiconductor device 100 to achieve electrical connection between it and an external substrate. For improvement of the reliability, the conductive bumps 7 used here may preferably be lead-free solder bumps that are high in strength and in melting-point temperature.

A metallic core layer 1a is provided inside of the substrate 1 as a core material thereof. A counterbore 10, that is, a concave portion in the surface of substrate 1, is provided at a portion for mounting the semiconductor element 6, causing the semiconductor element 6 to be connected to the metallic core layer 1a which is provided as the core material of the substrate 1 by using the conductive adhesive 4, such as an epoxy-based adhesive agent or equivalents thereto.

On one of the both principal surfaces of the substrate 1, i.e., the principal surface with the conductive bumps 7 being disposed thereon, the counterbore 10 for heat radiation is disposed at a central part thereof. The counterbore 10 is provided with a thin metal plate 8, which is connected via a soldering material 9 to the metallic core layer 1a.

During manufacture of the semiconductor device 100, parts or components corresponding to a plurality of semiconductor devices are mounted together on a single sheet, followed by dicing thereof at the last step to thereby fabricate more than two semiconductor devices 100. As for the metallic core layer 1a, a one metal plate is disposed on the sheet; thereafter at the last step, dicing is applied thereto, resulting in fabrication of the metallic core layer 1a. Due to this, part of the metallic core layer 1a which was cut by dicing is exposed to an outer circumferential face if of the substrate 1.

It should be noted that the semiconductor element 6 and the electronic component 3 are connected using the conductive adhesive 4 such as silver paste or the like so that unwanted exfoliation or "peel-off" and interconnect wire disconnection no longer take place even in the case of connection using the lead-free conductive bumps 7, which are subjected to a reflow process at high temperatures. Thus, no appreciable reliability problems occur.

At connection portions of the electronic component 3 and connection portions of the conductive bumps 7 on the substrate 1, Ni—Au-based plating 1e is applied to upper part of Cu-based conductors 1d. Additionally on the metallic core layer 1a with the semiconductor element 6 mounted thereto is applied Ni—Au plating 1e.

For the reliability improvement purpose, it is desirable that the substrate 1 be matched or "harmonized" in physical properties with the thermal hardenable resin 5. To do this, the physical properties of the resin material making up the substrate 1 are preferably designed so that the linear expansion coefficient falls within a range of from 20 to 70 ppm/° C. while letting the glass transition temperature stay at 150° C. or more.

In accordance with this embodiment, it is possible without having to use high-density mount parts to provide the intended semiconductor device of low cost which offers superior heat releasability. It is also possible to improve the reliability because of the fact that it is no longer required to lessen the diameter of conductive bumps while eliminating the use of any narrow-pitch semiconductor package.

Embodiment 2

Figure 3:
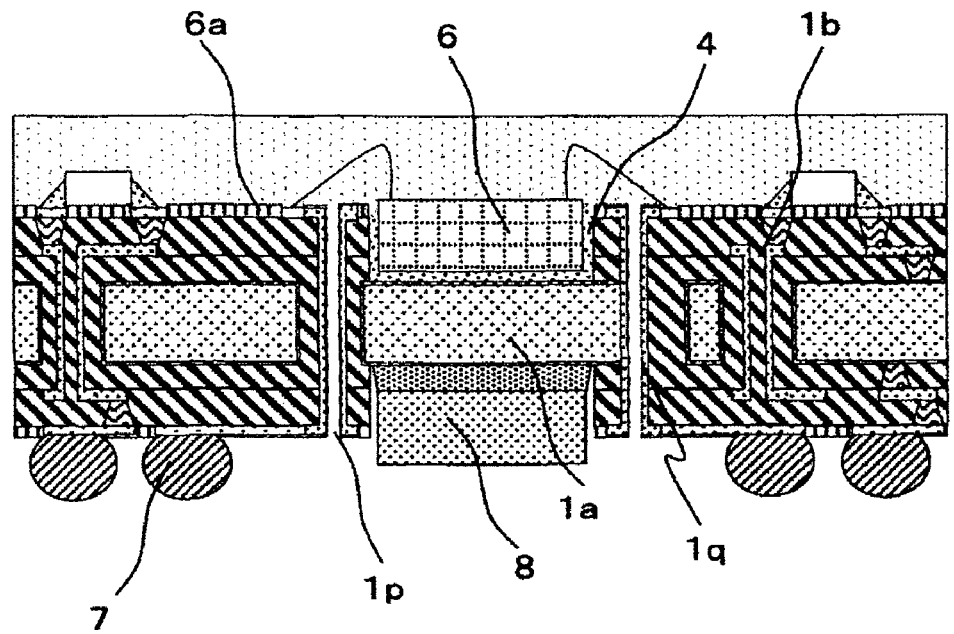
FIG. 3 is a cross-sectional diagram of a semiconductor device in accordance with a second embodiment of the invention.

Turning to FIG. 3, there is shown a cross-sectional view of a semiconductor device 200 in accordance with a second embodiment of the invention.

The semiconductor device 200 is structurally different from the semiconductor device 100 of FIGS. 1-2 in that through-going holes 1p and 1q are provided in the substrate 1. The semiconductor device 200 is principally the same in other arrangements as the semiconductor device 100.

If the through-holes 1p-1q are absent then a need arises to rail interconnect wires by way of more than two inner via holes 1c when performing electrical connection from the side of semiconductor element mount face 6a to the conductive bump 7 layout side. This results in an increase in number of fabrication process steps in the manufacture of the substrate 1.

Employing the semiconductor device 200 with the through-holes 1p-1q defined therein makes it possible to use the through-hole 1p to readily perform direct electrical connection of from the semiconductor element mount face 6a side to the conductive bump 7 layout side. This avoids the need to extend through the more than two inner via holes 1c. Thus it becomes possible to reduce the fabrication process number of inner via holes 1c, when compared to the semiconductor device 100 shown in FIGS. 1-2.

Also note that the through-hole 1q is electrically connected to the metallic core layer 1a also. This feature is also devoted to improvements in heat releasability.

Embodiment 3

Figure 4:
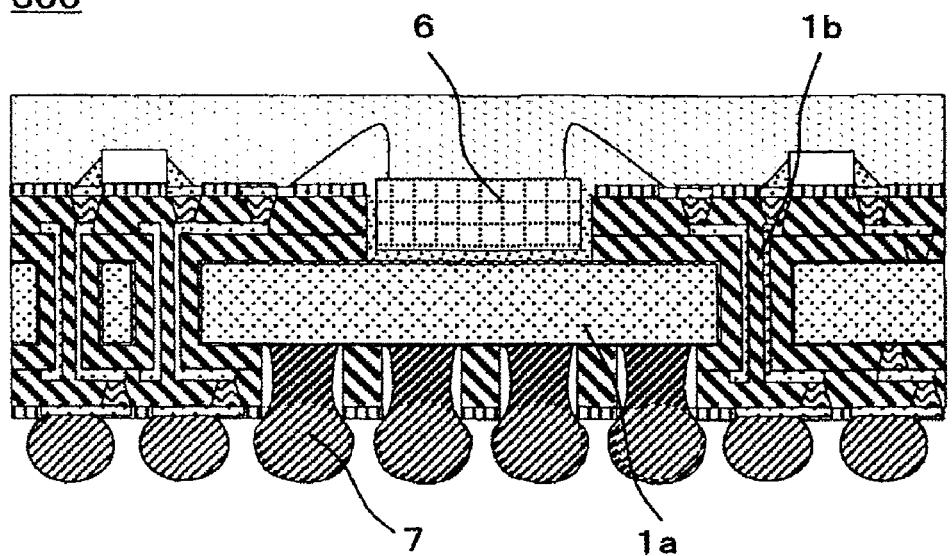
FIG. 4 is a sectional view of semiconductor device in accordance with a third embodiment of the invention.

See FIG. 4, which is a cross-sectional view of a semiconductor device 300 in accordance with a third embodiment of the invention.

The semiconductor device 300 is different from the semiconductor device 100 of FIG. 1 in that some of the conductive bumps 7 are directly connected to the metallic core layer 1a which underlies the semiconductor element 6. The semiconductor device 300 is fundamentally the same in other arrangements as the semiconductor device 100.

As the semiconductor device 300 is arranged so that the conductive bumps 7 are directly connected to the metallic core layer 1a, it is possible to ground wires on or above the substrate 1 by the conductive bumps 7 underlying the metallic core layer 1a. With this structure, it becomes possible in the semiconductor device 300 to use the metallic core layer la as a ground potential layer. Also importantly, the conductive bumps that are provided beneath the metallic core layer 1a function as the ground, and the metallic core layer 1a to be connected to these conductive bumps is designed to have a specific area and thickness. This enables the semiconductor device 300 to retain a "robust" ground potential with maximized stability.

Another advantage is that the direct connection between the metallic core layer 1a that becomes the ground potential and the conductive bumps 7 strengthens the ground potential and thus enables mounting of large-current circuitry and power semiconductor circuit elements.

The conductive bumps 7 as coupled to the metallic core layer 1a are capable of offering increased reliability of more than 1,000 cycles of thermal shock tests.

Embodiment 4

Figure 5:
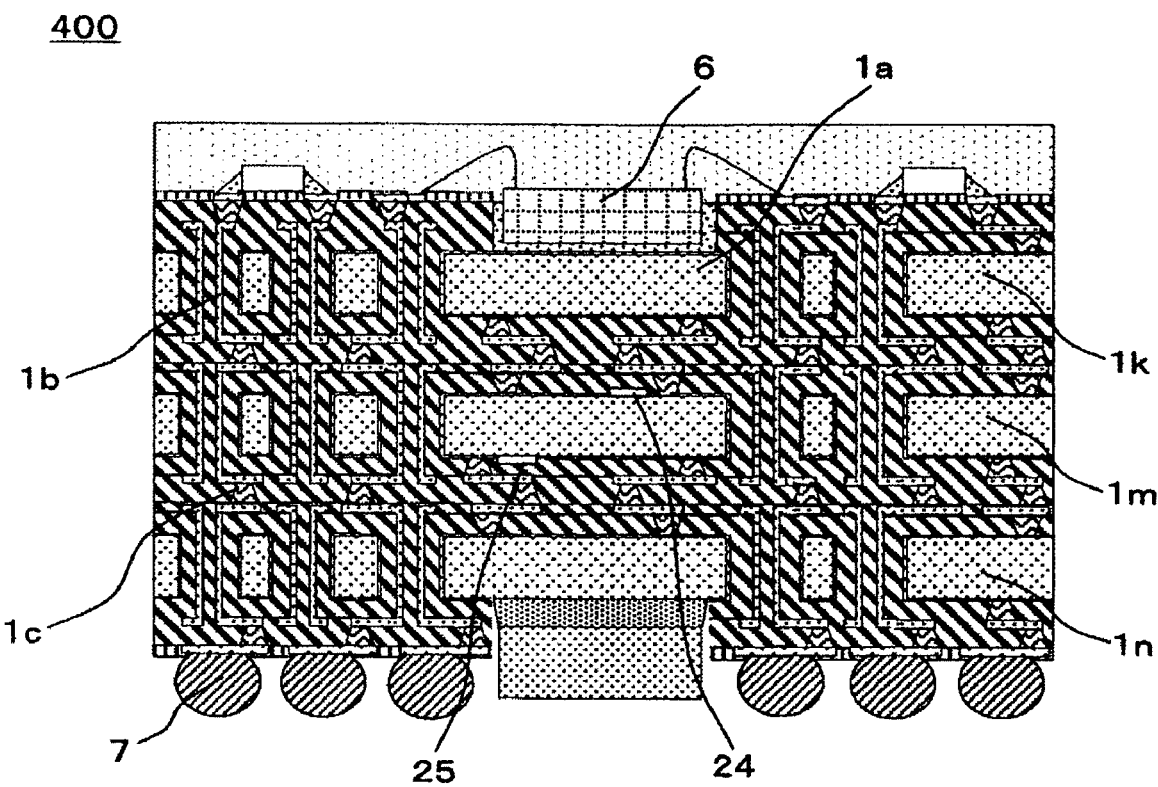
FIG. 5 is a sectional view of semiconductor device in accordance with a fourth embodiment.

See FIG. 5, which is a cross-sectional view of a semiconductor device 400 in accordance with a fourth embodiment.

The semiconductor device 400 is the one that provides a multilayered substrate structure by repeated lamination of the basic arrangement of the semiconductor device 100 shown in FIG. 1. The metallic core layer 1a is disposed on a per-substrate basis and is provided in each layer of such multilayer substrate.

A semiconductor element 6 is electrically connected to a metallic core layer 1a of the first layer (uppermost layer). It is connected to each metal core layer from the semiconductor element mount face 6a through inner via holes 1c, followed by connection to conductive bumps 7 from each metal core layer through inner via holes 1c.

In the semiconductor device 400, respective ones of the metallic core layers 1a at respective layers are adapted for use as a ground potential layer 1k, a power supply potential layer 1m and a power signal potential layer 1n, thereby to constitute each metallic core layer 1a as part of circuitry. With such an arrangement, it is possible to use a prior art circuit with bus-bar configuration to configure a specific circuit within the semiconductor device 400 without having to use bus bars. This in turn makes it possible to downsize the device while reducing production costs.

Also note that although respective stacked substrate layers are electrically connected together by way of through-going holes 1b and inner via holes 1c, a through-hole 1b for use as a signal transmission line has a hole as defined therein to thereby ensure that it does not come into contact with the ground potential layer 1k and/or the power supply potential layer 1m.

Additionally the substrate 1 has a passive circuit element 24 and an active element 25 as buried or "embedded" therein whereby it is possible to achieve miniaturization and high integration/packaging densities.

Embodiment 5

Figure 6:
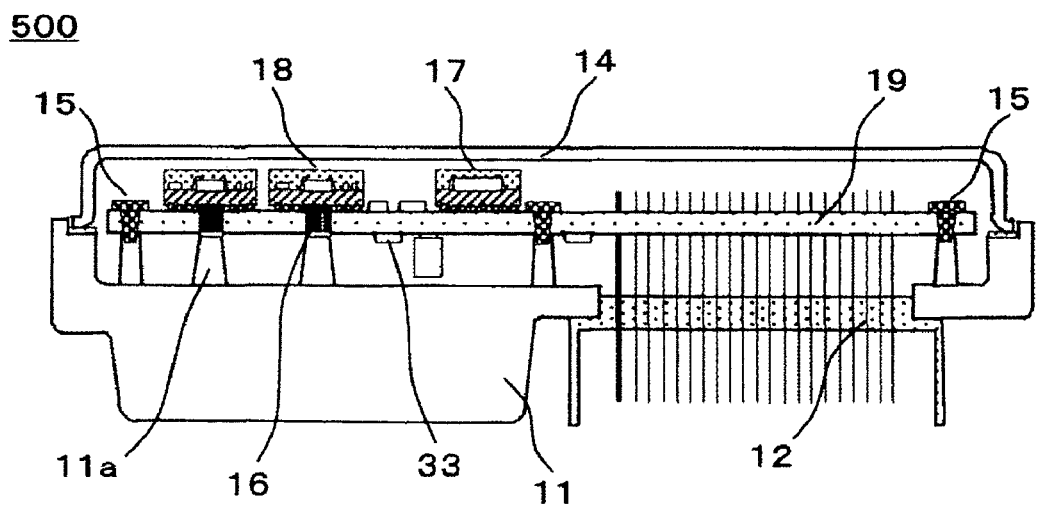
FIG. 6 is an overall sectional view of an electronic control unit in accordance with a fifth embodiment.
Figure 7:
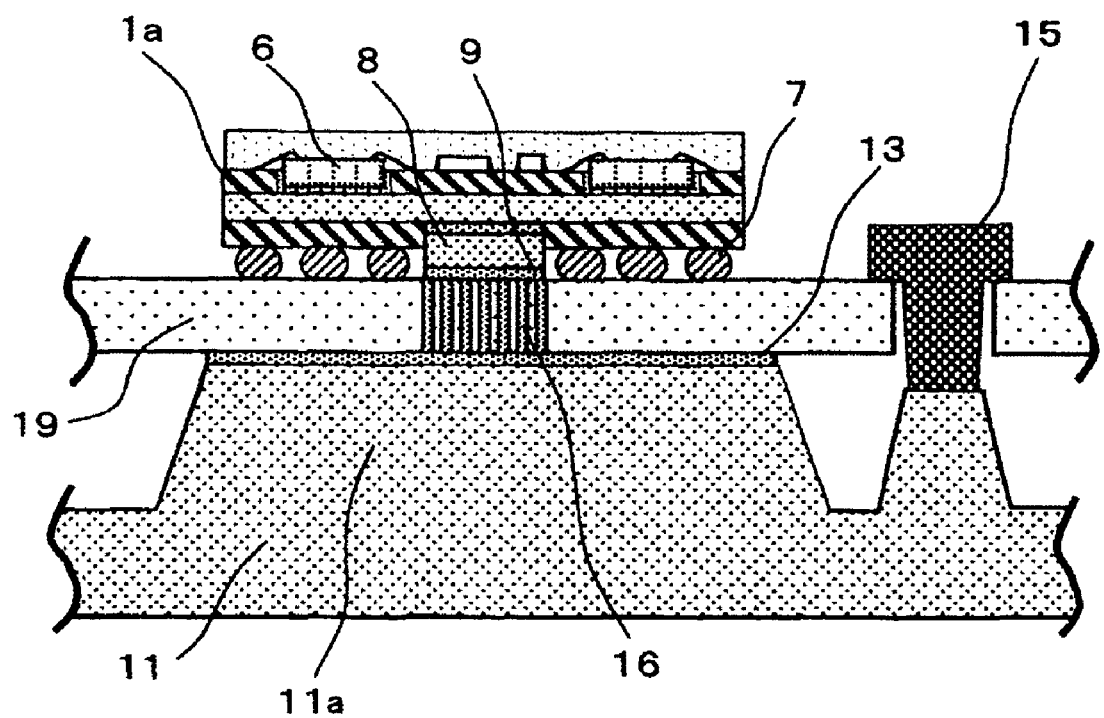
FIG. 7 is an enlarged partial sectional view of the apparatus shown in FIG. 6.

Referring next to FIGS. 6 and 7, there is shown the structure of an electronic control module 500 using a semiconductor device 18. The electronic controller 500 is adaptable for use as a land vehicle engine controller, for example. FIG. 6 is a sectional view of an entirety of the electronic controller 500 in this embodiment, whereas FIG. 7 is an enlarged partial sectional view of main part of it.

The electronic controller 500 has a metallic casing 11 made of aluminum or other similar suitable metals. The metal case 11 contains a board 19 as received therein. This board 19 is attached to hump-like portions or "protrusions" 11a of the metal case 11 and fixed thereto by a silicon-based adhesive 13. The board 19 is also fixed to the metal case 11 by substrate-fastening rivets 15, thereby ensuring rigid attachment between the board 19 and the metal case 11. The interior of the electronic controller 500 is air-tightly sealed by a cover 14 as attached to the metal case 11.

On the board 19, a ball grid array (BGA) 17 and semiconductor device 18 plus electronics components 33 are disposed. The electronic components 33 are mounted not only on the semiconductor device 18-mounting principal surface side of the board 19 but also on the opposite-side principal surface thereof.

A connector 12 is attached to the metal case 11. The connector 12 has a predefined number of connection pins for electrical connection between the circuitry on the board 19 and an external device or equipment as operatively associated therewith. These pins are fixed to the board 19. Although in this embodiment the connector 12 are provided at lower surface part of the metal case 11, this is not to be construed as limiting the invention and may alternatively be arranged so that these are provided at the metal case's upper face part or its side face part.

The semiconductor device 18 is similar in structure to the semiconductor devices as stated supra in the above-noted embodiments. More specifically, a semiconductor element 6 is mounted above a metallic core layer 1a, and a metal plate 8 that is disposed to underlie the metallic core layer 1a is connected to the metal core layer 1a. Owing to this structural feature, unwanted heat as radiated from the semiconductor element 6 is efficiently released or "escaped" toward the outside from the metal core layer 1a via the metal plate 8.

The BGA 17 and semiconductor device 18 have a plurality of conductive bumps 7 for the external signal input/output use. BGA 17 and semiconductor device 18 are electrically connected to the circuitry on the board 19 through these conductive bumps 7.

A thin metal plate 8 that is centrally disposed on the semiconductor device 18 is connected to the board 19 via a soldering material 9. In addition, a large number of thermal vias 16 are disposed in the board 19 at part immediately beneath the metal plate 8 of the semiconductor device 18. The thermal vias 16 are internally filled with the solder material 9 along with conductive paste. Upper part of the thermal vias 16 as filled with the solder material 9 and conductive paste is connected to the metal plate 8 of semiconductor device 18 by way of the solder material 9.

The protrusions 11a of the metal case 11 are disposed on one of the both principal surfaces of the board 19, which is on the opposite side to the principal surface to which the semiconductor device 18 is connected. The protrusions 11a are coupled to the board 19 via the silicon-based adhesive 13. For improvement of the heat releasability, it is preferable that the silicon-based adhesive 13 be designed to have its thermal conductivity of 1 W/m.K or greater and a thickness of 5 mm or more. Additionally, as an alternative to the silicon-based adhesive, a heat-release grease may also be employable.

According to the electronic control module of this embodiment, it becomes possible to efficiently release the heat radiated from the semiconductor device 18 toward the metal case 11 through the thermal vias 16 as filled with the solder material 9.

In addition, because of the use of the passive component-mounted semiconductor device, a minimal number of interconnect wires may be provided on or above the board for interconnection between semiconductor devices. This avoids the need to design the board to have high density, which makes it possible to employ a low-cost substrate(s).

Although the semiconductor device and electronic control unit of this invention have been explained in detail based on some specific embodiments thereof, these are not to be construed as limiting the invention. Various modifications and alterations may occur to those skilled in the art without departing from the technical concept of the invention as claimed. For example, in the electronic control module 500 as has been stated in the above-noted embodiment, BGA 17 is built therein which is advantageous for the downsizing of semiconductor packages and for improvements in heat releasability, this is not an exclusive one. Any electronic control unit is employable which comes with substitute elements having other structures as built therein.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising:
   a substrate with a circuit being disposed on a first principal surface;
   a semiconductor element being provided at the first principal surface of said substrate and being electrically connected by wire bonding to said circuit for interconnection therebetween;
   a metallic core layer encased within said substrate adjacent said semiconductor element and electrically connected to said semiconductor element; wherein a bottom surface of said semiconductor element directly attaches to a top surface of said metallic core layer through a conductive adhesive;
   a plurality of conductive bumps provided on a second principal surface opposite to the first principal surface of said substrate;
   a thermally hardenable sealing resin for sealing at least said semiconductor element and the first principal surface side of said substrate; and
   a metal member provided at the second principal surface and electrically connected to said metallic core layer, wherein a top surface of said metal member directly attaches to a bottom surface of said metallic core layer through a soldering material;
   wherein said substrate has therein a through hole for penetration between the first principal surface and the second principal surface;
   wherein said through hole is directly electrically coupled to said metallic core layer wherein a first counterbore is provided at the second principal surface of said substrate and wherein said metal member is provided within said first counterbore and said first counterbore exposes a portion of the bottom surface of said metallic core layer; and wherein a second counterbore is provided at the first principal surface of said substrate and wherein said semiconductor element is provided within said second counterbore and said second counterbore exposes a portion of the top surface of said metallic core layer.

2. The semiconductor device according to claim 1, wherein said first counterbore is disposed between said conductive bumps and said metallic core layer and wherein a selected one or ones of said conductive bumps are directly connected to said metallic core layer.

3. The semiconductor device according to claim 1, wherein said metal member is a metal plate.

4. The semiconductor device according to claim 1, wherein said metal member is more than one conductive bump.

5. The semiconductor structure according to claim 4, wherein said metallic core layer is used as a ground potential layer.

6. The semiconductor device according to claim 1, wherein said conductive bumps are lead-free solder bumps.

7. A semiconductor device comprising:
   a multilayer substrate structured by lamination of a plurality of substrates each having a circuit as disposed thereon;
   a plurality of metallic core layers as internally encased within said plurality of substrates;
   a semiconductor element at a first principal surface of said multilayer substrate provided on a substrate residing at an uppermost part of said multilayer substrate adjacent an uppermost one of the metallic core layers and electrically connected by wire bonding to said circuit for interconnection therebetween; wherein a bottom surface of said semiconductor element directly and electrically attaches to a top surface of said the uppermost one of the metallic core layers through a conductive adhesive; and
   a metal member being provided at a second principal surface opposite to the first principal surface of the multilayer substrate wherein said metal member resides at a lowermost part of said multilayer substrate and is electrically connected to a metallic core layer at the lowermost part, of said multilayer substrate; wherein a top surface of said metal member directly attaches to a bottom surface of said metallic core layer at the lowermost part of said multilayer substrate through a soldering material;

wherein said multilayer substrate has therein a through hole for penetration between the first principal surface and the second principal surface;

wherein said through hole is electrically coupled to said metallic core layer wherein a first counterbore is provided at the second principal surface of said multilayer substrate and wherein said metal member is provided within said first counterbore and said first counterbore exposes a portion of the bottom surface of said metallic core layer at the lowermost part of said multilayer substrate; and wherein a second counterbore is provided at the first principal surface of said multilayer substrate and wherein said semiconductor element is provided within said second counterbore and said second counterbore exposes a portion of the top surface of said the uppermost one of the metallic core layers.

8. The semiconductor device according to claim 7, wherein said plurality of metallic core layers are used as a part of the circuit to retain any one of a ground potential, a power supply voltage potential and a power signal potential.

9. The semiconductor device according to claim 7, wherein a passive element and an active element are buried within said multilayer substrate.

10. An electronic control unit comprising:
a metallic casing;
a board disposed within said metallic casing with a circuit being disposed on said board;
a semiconductor device as defined in claim 1 disposed on said board; and
a connector being fixed to said metallic casing and having a plurality of pins for connection to said circuit, wherein
said semiconductor device including said metal member being electrically connected to said metallic core layer and being exposed to outside of
said semiconductor device, said board is provided with a thermal via as filled with a conductive member, and
said metal member of said semiconductor device is electrically connected to said conductive member.

11. The electronic control unit according to claim 10, wherein said board is fixed by a protrusion as provided at said metallic casing and wherein said protrusion is provided to underlie said thermal via.

12. The electronic control unit according to claim 11, wherein thermal conductivity between said board and said protrusion is more than or equal to 1W/m·K and wherein these are connected together by a silicon-based adhesive with a thickness of 5 mm or less.

13. The electronic control unit according to claim 10, wherein said conductive member is a soldering material.

* * * * *